(12) United States Patent
Bhatia (10) Patent No.: US 9,633,850 B2
(45) Date of Patent: Apr. 25, 2017

(54) MASKING METHODS FOR ALD PROCESSES FOR ELECTRODE-BASED DEVICES

(71) Applicant: Ultratech, Inc., San Jose, CA (US)

(72) Inventor: Ritwik Bhatia, Newton, MA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 15/210,095

(22) Filed: Jul. 14, 2016

(65) Prior Publication Data

US 2017/0025272 A1    Jan. 26, 2017

Related U.S. Application Data

(60) Provisional application No. 62/194,426, filed on Jul. 20, 2015.

(51) Int. Cl.

| | | |
|---|---|---|
| *H01L 21/033* | (2006.01) | |
| *H01L 23/00* | (2006.01) | |
| *H01L 49/02* | (2006.01) | |
| *H01G 9/00* | (2006.01) | |
| *H01G 9/045* | (2006.01) | |
| *H01G 9/04* | (2006.01) | |

(52) U.S. Cl.
CPC ....... *H01L 21/0331* (2013.01); *H01G 9/0029* (2013.01); *H01G 9/045* (2013.01); *H01L 21/0332* (2013.01); *H01L 24/03* (2013.01); *H01L 28/40* (2013.01); *H01L 28/60* (2013.01); *H01G 2009/0408* (2013.01); *H01L 2224/03472* (2013.01); *H01L 2924/014* (2013.01); *H01L 2924/1205* (2013.01)

(58) Field of Classification Search
None
See application file for complete search history.

(56) References Cited

U.S. PATENT DOCUMENTS

| | | |
|---|---|---|
| 4,814,289 A | 3/1989 | Baeuerle |
| 5,480,462 A | 1/1996 | Tuttle |
| 5,628,917 A | 5/1997 | MacDonald et al. |
| 5,696,394 A | 12/1997 | Jones, Jr. et al. |
| 5,926,359 A | 7/1999 | Greco et al. |

(Continued)

OTHER PUBLICATIONS

Search Report dated Nov. 28, 2016, issued by the Intellectual Property Office of Singapore in connection with Singapore Patent Application No. 10201605769R.

*Primary Examiner* — Asok K Sarkar
(74) *Attorney, Agent, or Firm* — Opticus IP Law PLLC (57) ABSTRACT

Masking methods for atomic-layer-deposition processes for electrode-based devices are disclosed, wherein solder is used as a masking material. The methods include exposing electrical contact members of an electrical device having an active device region and a barrier layer formed by atomic layer deposition. This includes depositing solder elements on the electrical contact members, then forming the barrier layer using atomic layer deposition, wherein the barrier layer covers the active device region and also covers the solder elements that respectively cover the electrical contact members. The solder elements are then melted, which removes respective portions of the barrier layer covering the solder elements. Similar methods are employed for exposing contacts when forming layered capacitors.

21 Claims, 10 Drawing Sheets

(56) References Cited

U.S. PATENT DOCUMENTS

| | | |
|---|---|---|
| 6,717,193 B2 | 4/2004 | Olewine et al. |
| 7,939,932 B2 | 5/2011 | Martin |
| 8,445,937 B2 | 5/2013 | Carcia |
| 2006/0240662 A1 | 10/2006 | Conley, Jr. et al. |
| 2008/0157395 A1 | 7/2008 | Belanger et al. |
| 2009/0130608 A1 | 5/2009 | Irving et al. |
| 2009/0159119 A1 | 6/2009 | Basol |
| 2010/0164083 A1 | 7/2010 | Yim |
| 2012/0052681 A1 | 3/2012 | Marsh |
| 2012/0098146 A1 | 4/2012 | Lee |
| 2012/0282419 A1 | 11/2012 | Ahn |
| 2013/0009264 A1 | 1/2013 | Pankow |
| 2013/0177760 A1 | 7/2013 | Dickey |
| 2016/0336286 A1* | 11/2016 | Katkar .................... H01L 24/14 |
| 2016/0345440 A1* | 11/2016 | Kasagani ............. H05K 3/0079 |

* cited by examiner

MASKING METHODS FOR ALD PROCESSES FOR ELECTRODE-BASED DEVICES

CROSS-REFERENCE TO RELATED APPLICATIONS

The present application claims the benefit of priority under 35 USC §119(e) of U.S. Provisional Patent Application No. 62/194,426, filed on Jul. 20, 2015, and which is incorporated by reference herein.

FIELD

The present disclosure relates to atomic layer deposition (ALD), and in particular to masking methods for ALD processes use for forming electrode-based devices.

The entire disclosure of any publication or patent document mentioned herein is incorporated by reference, including: U.S. Pat. Nos. 4,814,289; 5,696,394; 6,717,193; 7,939,932; and 8,445,937, and U.S. Pre-Grant Patent Application Publications No. US 2010/0164083; US 2012/0098146; US 2013/0009264; and US 2013/0177760.

BACKGROUND

ALD is a deposition method wherein very thin (i.e. atomic) layers of material can be deposited on a surface. ALD tends to be non-selective, i.e., films are deposited conformally on all exposed surfaces.

ALD can be employed at the packing level in the manufacturing of electronic devices to form a coating on the electronic device, wherein the coating serves as a gas, humidity or water-proof barrier layer. Such coatings can be used, for example, in organic light-emitting devices (OLEDs), digital mirror devices (DMDs), micro-electrical-mechanical (MEMS) devices, solar cells, sensors, capacitors and integrated circuit (IC) devices whose operation benefits from being hermetically sealed from the environment. Typical coatings deposited via ALD as a barrier layer include dielectric films such as $Al_2O_3$ and $TiO_2$, metallic conductive films like TiN, Pt, Ru, and transparent conductors like indium tin oxide and aluminum doped zinc oxide Many electronic devices include at least one area that needs to remain uncoated so that it can be accessed. An example of such an area includes contacts pads or contact pins that are used to establish electrical communication between the electronic device and an outside electrical source such as a power source. The contact pads or contact pins need to be exposed so that the electrical contact can be established. This means that the barrier layer or other such layer or layers (e.g., metal and dielectric layers of a capacitor) cannot cover the contact pads or contact pins. This requires either selective removal of the portions of the barrier layer or other such layer that covers the contact pads or contact pins.

The selective removal of a barrier layer has typically been accomplished mechanically or by masking the contact pads or contact pins using masking or dicing tape. These approaches have distinct disadvantages, including damaging the contact pads or contact pins, compromising the quality of the contact, and limiting the temperature of deposition of ALD films.

SUMMARY

The present disclosure is directed to masking methods for ALD processes for electrode-based devices, wherein solder is used as a masking material. The methods include exposing electrical contact members of an electrical device having an active device region and a barrier layer formed by ALD. This includes depositing solder elements on the electrical contact members, then forming the barrier layer using ALD, wherein the barrier layer covers the active device region and also covers the solder elements that respectively cover the electrical contact members. The solder elements are then melted, which removes respective portions of the barrier layer covering the solder elements. Similar methods are employed for exposing contacts when forming layered capacitors wherein at least one portion of an underlying metal layer needs to be exposed to form an electrical contact.

An aspect of the disclosure is a method of exposing electrical contact members of an electrical device having an active device region and a barrier layer formed by ALD. The method includes: depositing solder elements on the electrical contact members; forming the barrier layer using ALD, wherein the barrier layer covers the active device region and also covers the solder elements that respectively cover the electrical contact members; and melting the solder elements to remove respective portions of the barrier layer covering the solder elements.

Another aspect of the disclosure is the method described above, wherein the barrier layer includes at least one of $Al_2O_3$, $SiO_2$, $TiO_2$ and $ZrO_2$.

Another aspect of the disclosure is the method described above, wherein the solder elements are formed using solder-bump technology.

Another aspect of the disclosure is the method described above, wherein the electrical contact members are located around at least a portion of a perimeter of the active device region.

Another aspect of the disclosure is the method described above, wherein melting the solder elements includes applying heat to the solder elements through the barrier layer.

Another aspect of the disclosure is the method described above, wherein the heat is provided by a laser.

Another aspect of the disclosure is the method described above, and further including removing the solder elements from the electrical contact members to expose the electrical contact members.

Another aspect of the disclosure is the method described above, wherein at least portions of each of the solder elements remain on the respective electrical contact members.

Another aspect of the disclosure is the method described above, wherein the active device region includes at least one of: a light-emitter, a light sensor, a MEMS device, an electrolytic capacitor and a DMD device.

Another aspect of the disclosure is the method described above, and further including establishing an electrical contact with one or more of the electrical contact members.

Another aspect of the disclosure is the method described above, wherein the electrical contact members include electrical contact pads or electrical contact pins.

Another aspect of the disclosure is a method of providing at least one electrical contact for an electrode-based electrical device. The method includes: a) depositing a first metal layer on a support substrate using an ALD process, wherein the first metal layer defines a first electrode; b) depositing at least one first solder element on the first metal layer; c) forming an insulating layer over the first metal layer and the at least one first solder element; d) melting the first solder element to remove a corresponding portion of the insulating layer to form at least one exposed portion of the first metal layer; e) depositing at least one second solder element on the at least one exposed portion of the first metal layer; f) adding a second metal layer over the insulating layer and the at least one second solder element to define a second electrode; and g) melting the at least one second solder element to expose at the least one exposed portion of the first metal layer to define the at least one electrical contact for the first electrode.

Another aspect of the disclosure is the above method, wherein the electrode-based electrical device is a capacitor.

Another aspect of the disclosure is the above method, wherein forming the insulating layer includes depositing an insulating material using an ALD process.

Another aspect of the disclosure is the above method, wherein the insulating material is $Al_2O_3$.

Another aspect of the disclosure is the above method, wherein the support substrate includes a micro-capillary plate made of an insulating material.

Another aspect of the disclosure is the above method, wherein at least one of the first and second metal layers is made of platinum.

Another aspect of the disclosure is the above method, wherein the support substrate includes high-aspect-ratio features.

Another aspect of the disclosure is the above method, wherein the electrode-based electrical device is a metal-oxide-metal capacitor.

Another aspect of the disclosure is the above method, wherein the at least one first and second solder elements include respective pluralities of the first and second solder elements.

Another aspect of the disclosure is the above method, wherein act e) includes the at least one second solder element covering a portion of the insulating layer immediately adjacent the at least one exposed portion of the first metal layer, and wherein act g) exposes the portion of the insulating layer that was covered in act e).

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

The term "solder" is used herein to describe a material that has a melting temperature higher than ALD deposition temperatures but lower than that of the dielectric and metal layers that constitute the electrode-based devices that are subjected to the masking and processing techniques disclosed herein. The term "solder" thus includes but is not limited to relatively low-melting alloys, such as those that include tin or lead or brass or silver or copper or zinc or indium or bismuth or gallium or mercury, or combinations thereof. An example definition for solder as the term is used herein is a material with a melting point higher than ALD deposition temperatures and with low vapor pressure at ALD deposition temperatures, wherein the melting point is sufficiently low to allow for removal of the material from an electrode-based device via application of heat to the device where the material is located, without damaging the underlying layer or layers while also selectively removing corresponding portions of an overlying layer or layers.

Example Electronic Device and Masking Process

Figure 1A:
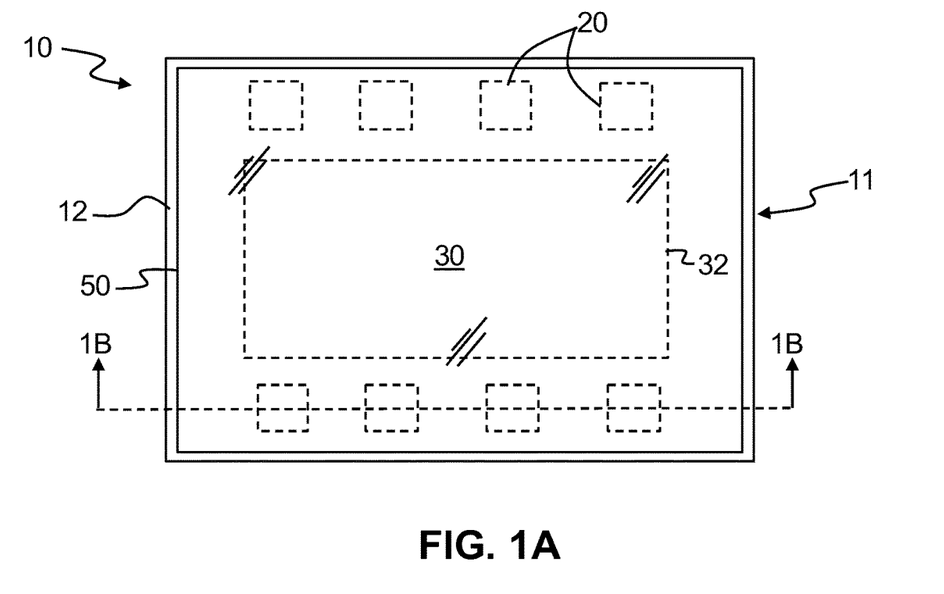
FIG. 1A is a top-down schematic diagram of an example electronic device showing an active device region, electrical contact members surrounding a perimeter of the active device region, and an ALD barrier layer covering the surface of the electronic device.

FIG. 1A is a top-down view of an example electronic device 10 that has a substrate 11 with a surface 12 on which is formed electrical contact members 20 and an active device region 30 having a perimeter 32. The electrical contact members 20 are shown in the form of contact pads, but can also be in the form of contact pins. The electrical contact members 20 are typically relatively large as compared to the other device features, e.g., 200 microns or larger. In an example, the electrical contact members 20 are located on the surface 12 adjacent the perimeter 32 of active device region 30. In an example, ALD is used to form a coating or "barrier layer" 50 that covers the surface 12 and encapsulates or seals the active device region 30 and also covers the electrical contact members 20.

Figure 1B:
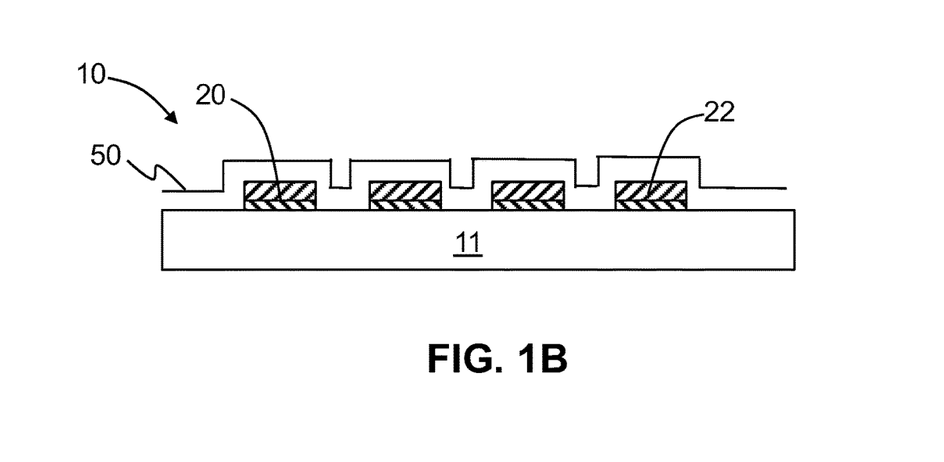
FIG. 1B is a cross-sectional view of the electronic device of FIG. 1A as taken along the line 1B-1B therein, showing solder elements formed on each of the electrical contact members, with the ALD barrier layer covering the solder elements.

FIG. 1B is a cross-sectional side view of the structure of FIG. 1A and shows solder elements 22 formed on each of the electrical contact members 20, and also shows the substantially conformal barrier layer 50 that covers the surface features of the electronic device 10. The solder elements 22 serve as mask elements for the electrical contact members 20 and have a higher melting temperature than the ALD process temperature used to form the barrier layer 50 but a lower melting temperature than the metal (e.g., copper) that makes up the electrical contact members 20. The selective deposition of solder elements 22 can be accomplished using known solder-bump technology.

Figure 1C:
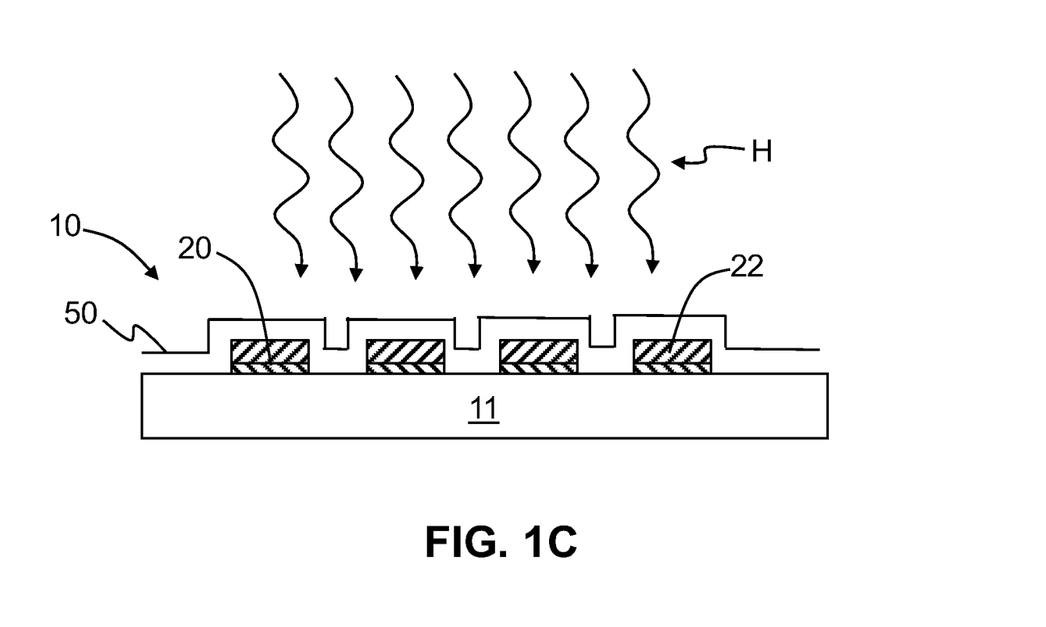
FIG. 1C is similar to FIG. 1B and illustrates the application of heat to the structure of FIG. 1B to melt the solder elements.
Figure 1D:
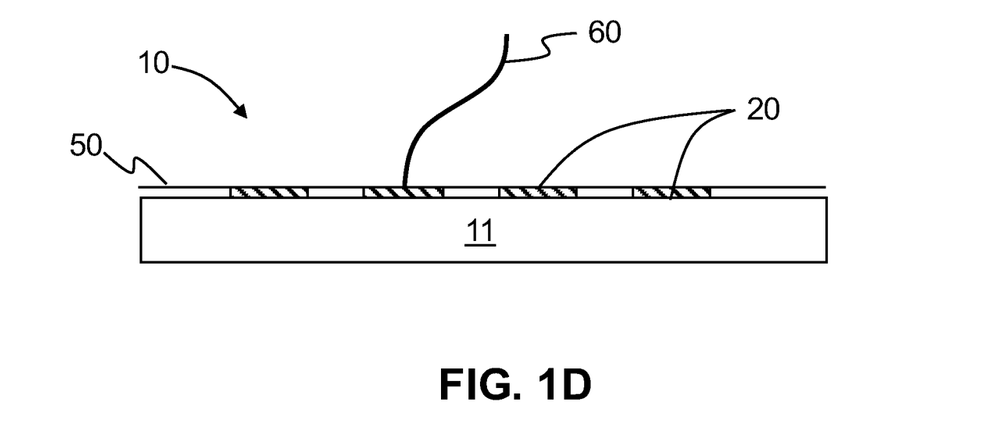
FIG. 1D is similar to FIG. 1C and shows the solder elements having been melted, resulting in the local removal of portions of the ALD barrier layer from above the electrical contact members, thereby exposing the electrical contact members and allowing for electrical connection thereto.

FIG. 1C is similar to FIG. 1B and shows the structure of electronic device 10 as heat H is applied to the structure to melt the solder elements 22. In an example, heat H is applied using a heat source such as a laser. In another example, heat H is applied by a conventional heat source. In an example, the heat H is applied locally at the location of solder elements 22. The melting of solder elements 22 serves to locally remove the corresponding portion of barrier layer 50 above the electrical contact members 20, thereby exposing the electrical contact members 20 while leaving the other portion of the barrier layer 50 generally intact, as shown in FIG. 1D. The solder elements 22 thus act as low-temperature localized mask elements that are readily removed by the application of heat H, wherein the amount of heat H does not melt the electrical contact members 20 or damage the electronic device 10 if it is temperature sensitive.

In an example, at least a portion of each solder elements 22 becomes part of the corresponding electrical contact member 20. This does not compromise the electrical contact member 20 because the solder material, like the electrical contact member 20, is conducting. In another example, the solder elements 22 are substantially entirely removed from the structure, leaving the exposed electrical contact members 20 without any substantial solder residue thereon. Removal of melted solder elements 22 can be accomplished using means well known in the art, such as a de-solder gun, a solder sucker, or a solder wick or braid.

FIG. 1D also shows an electrical wire 60 used to establish electrical contact with one of the electrical contact members 20 once they are exposed as described above.

Electrolytic Capacitor Example

Dielectric ALD coatings are used in electrolytic capacitors to form a metal-dielectric electrode portion of the capacitor, while an electrolyte forms the second electrode. The dielectric ALD coating is used to cover the 3D structure but in the deposition process also covers the metal layer, making it difficult to access the metal electrode. Thus, in an example solder elements 22 is used as a mask to form an electrical contact in the flat (non-3D) metal region of the capacitor.

Figure 2A:
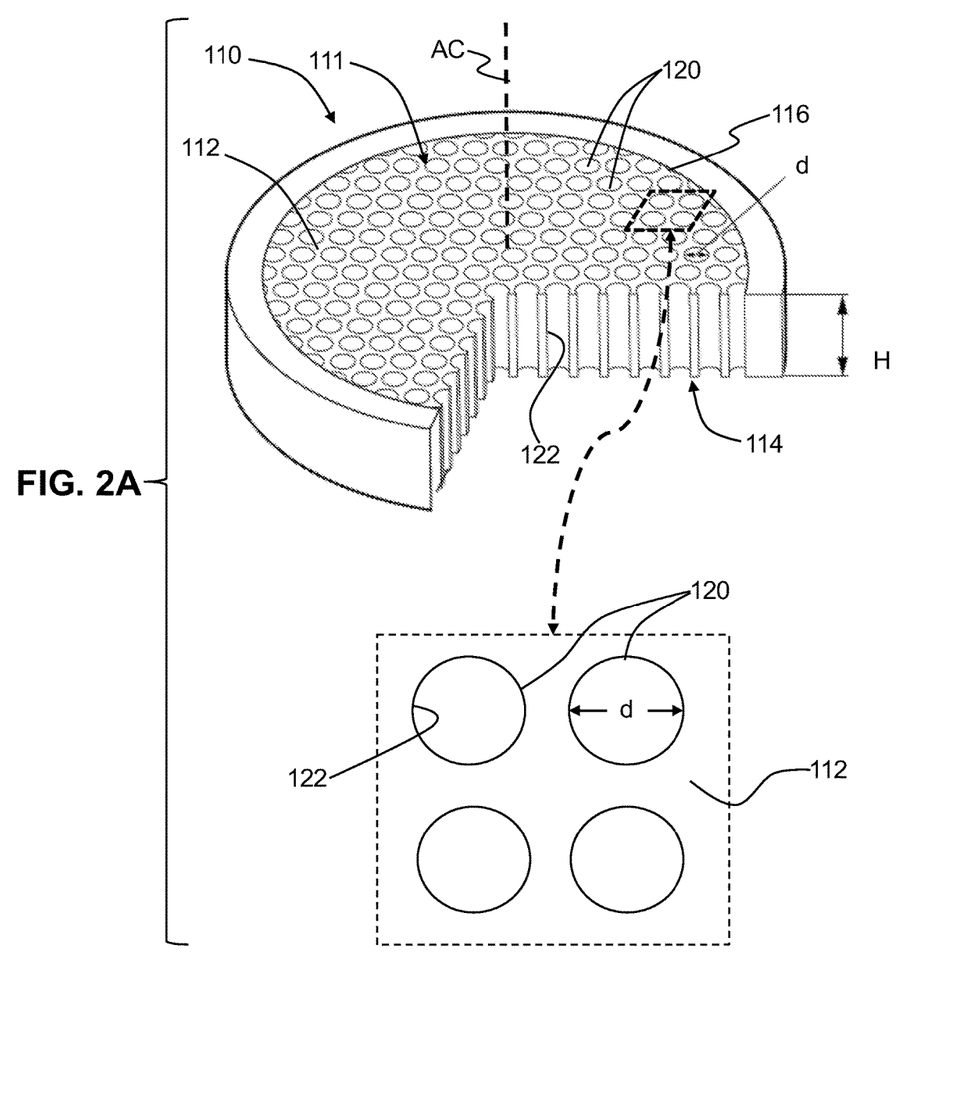
FIGS. 2A through 2G are schematic diagrams that illustrate an example method of processing a microcapillary plate to form a capacitor using the masking methods disclosed herein.

Thus, another application of the methods disclosed herein is for an electronic device 10 in the form of an electrolytic capacitor. FIG. 2A is a top elevated view of an example micro-capillary plate 110 used to form the electrolytic capacitor. The example micro-capillary plate 110 is disk-shaped and has a body 111, a top surface 112, a bottom surface 114, an inner edge 116, a central axis AC and a plurality of cylindrical micro-holes 120 (hereinafter, "capillaries"). In an example, the body 111 is made of an insulating material such as glass. The capillaries 120 are open at the top and bottom surfaces 112 and 114 and run parallel to the central axis AC. Each capillary 120 has an inner surface 122 and diameter d, which in an example can be from about 2 microns to several hundred microns. The close-up inset of FIG. 2A is a top-down view of section of the micro-capillary plate 110 showing four of the capillaries 120.

Figure 2B:
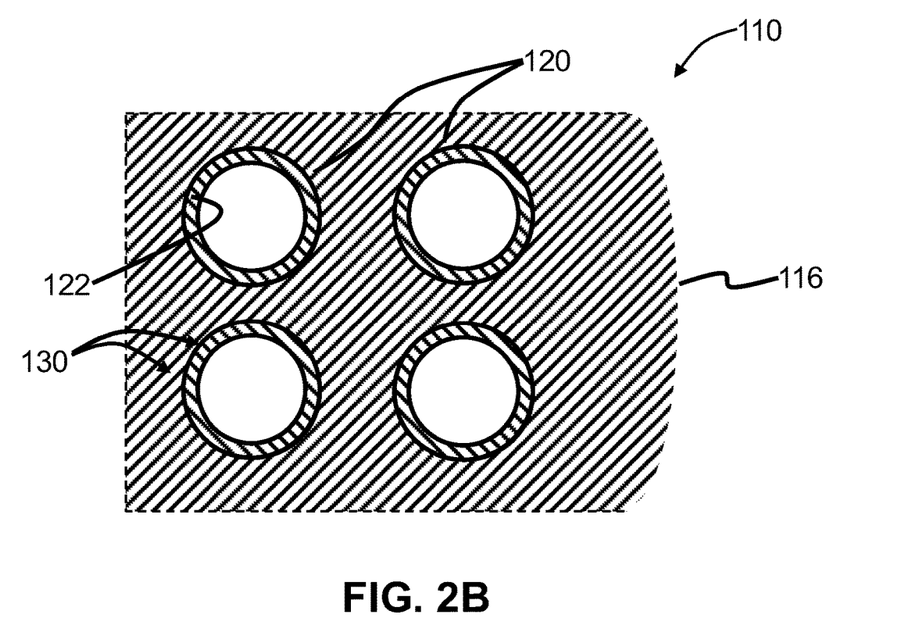

The formation of an electrolytic capacitor involves performing a number of process steps on the micro-capillary plate 110. FIG. 2B is similar to the close-up inset of FIG. 2A and shows four capillaries 120 in a section adjacent the inner edge 116 of the array of capillaries, and illustrates a first process step wherein a first metal layer 130 is deposited on the top surface 112 and the inner surface 122 of capillaries 120 using an ALD process. In an example, the first metal layer 130 is platinum. Note that the conformality of the ALD process allows for deposition of the first metal layer 130 so that it covers the inner surface 122 of capillaries 120 as well as the top surface 112. The first metal layer 130 serves as a first electrode for the electrolytic capacitor being formed.

Figure 2C:
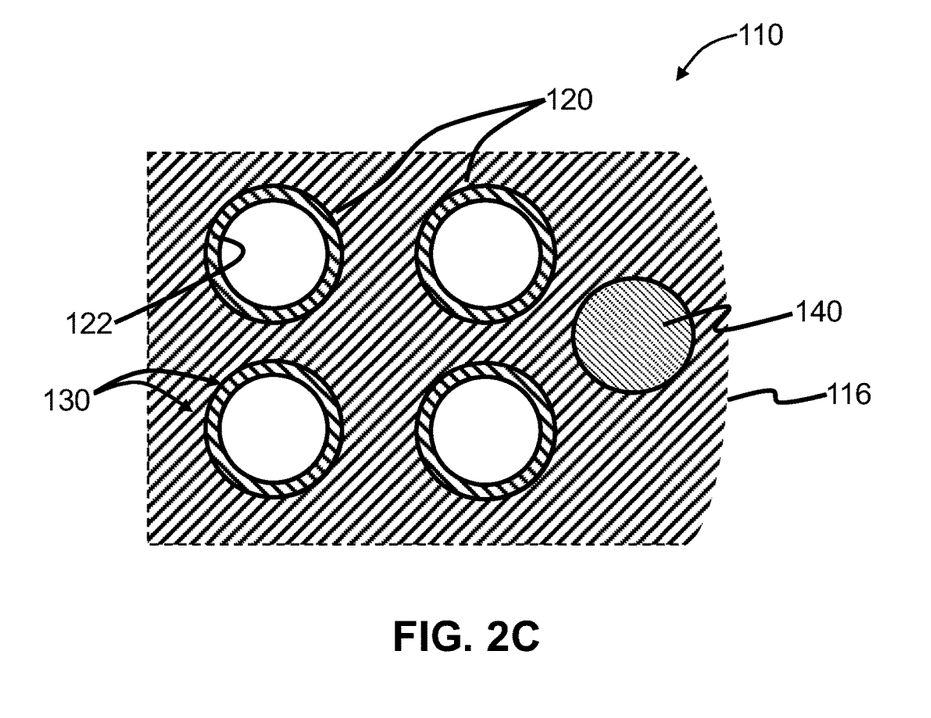

FIG. 2C illustrates as second process step wherein a small patch of solder 140 is deposited atop of the first metal layer 130 on the top surface 112 near the inner edge 116 of the array of capillaries 120. The solder 140 serves as a mask for the next step in the process.

Figure 2D:
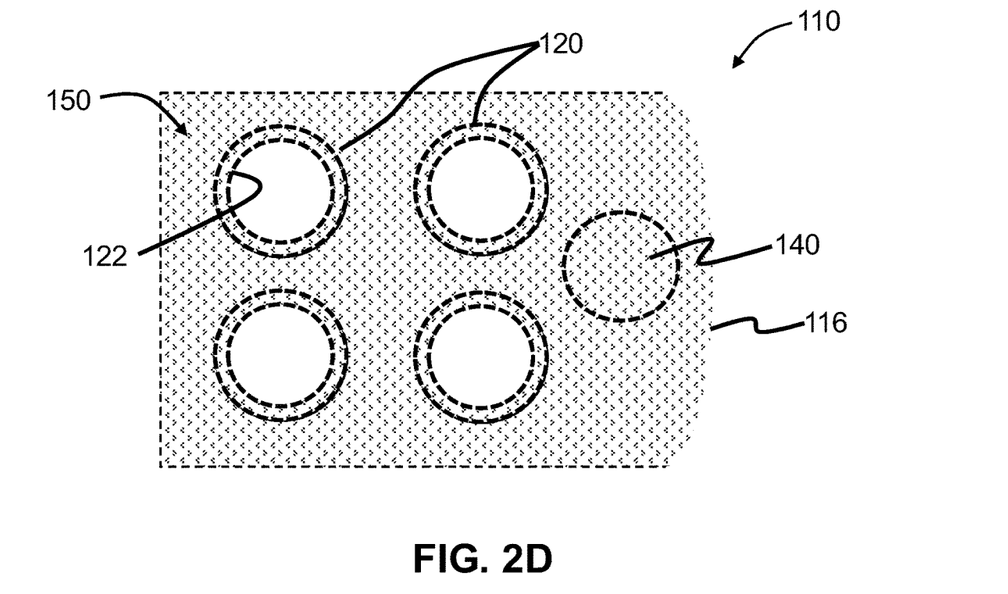

FIG. 2D illustrates a third process step wherein an insulating layer 150 is formed over the first metal layer 130 using an ALD process. An example material for the insulating layer 150 is a dielectric material such as $Al_2O_3$.

Figure 2E:
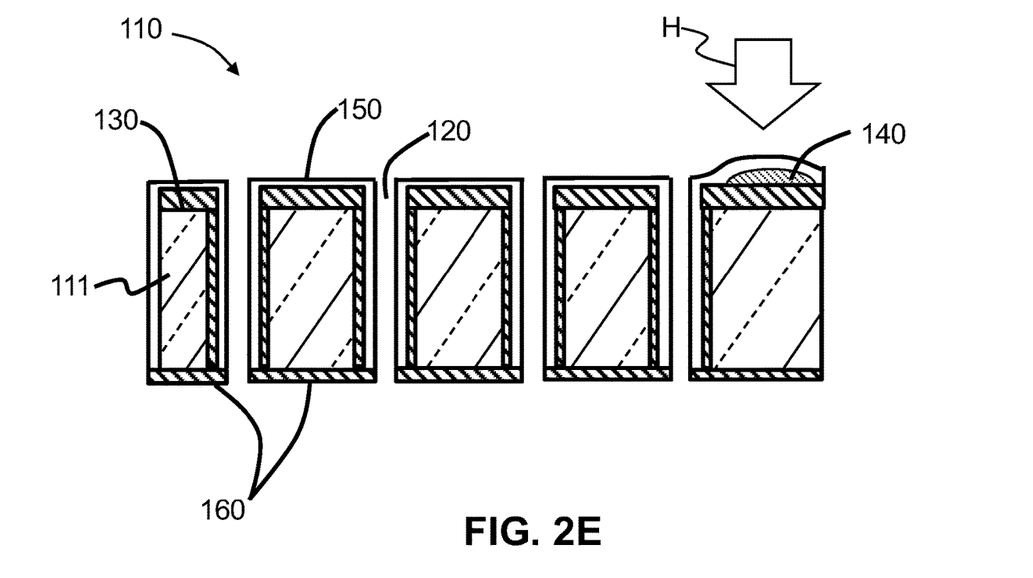

FIG. 2E is a cross-sectional view of the micro-capillary plate 110 in FIG. 2D and further illustrates a fourth process step wherein a second metal layer 160 is formed on the bottom surface 114 of the micro-capillary plate 110 to serve as a second electrode. In an example, this is accomplished by partially inserting the micro-capillary plate 110 into an electrolytic solution.

Figure 2F:
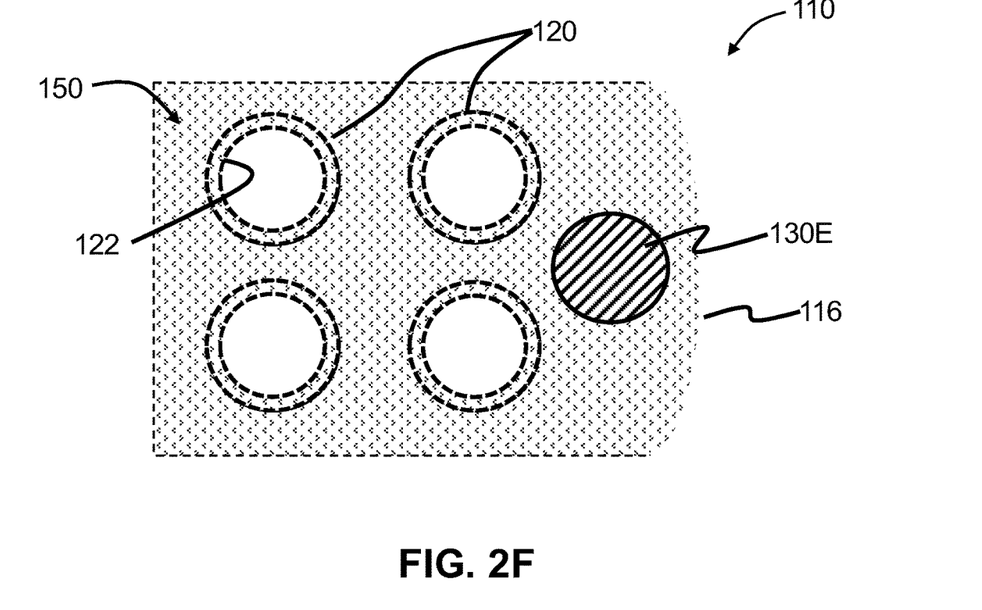
Figure 2G:
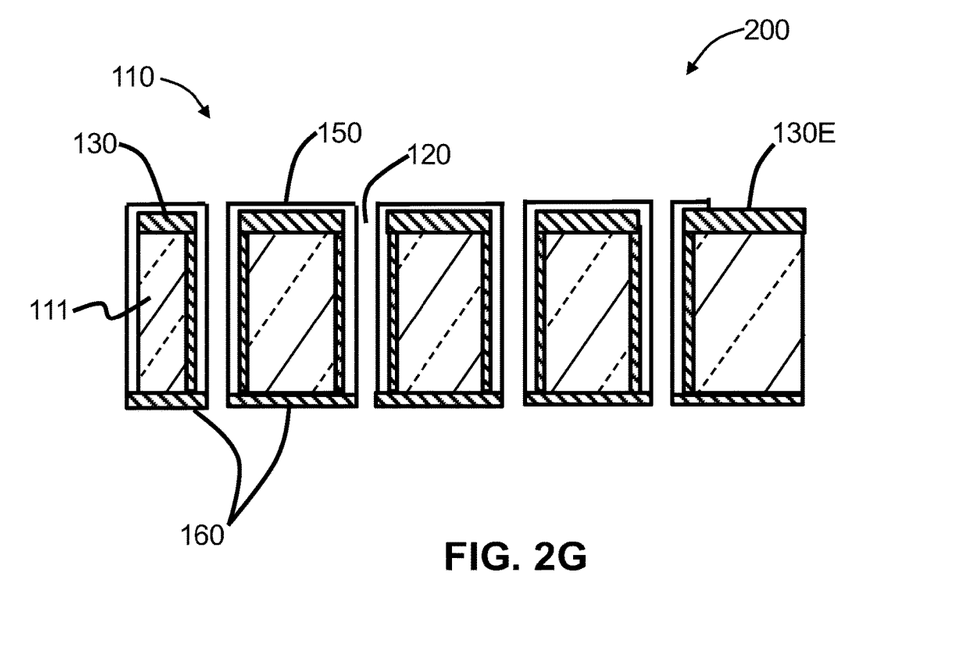

FIG. 2F is similar to FIG. 2D and shows the results fifth process step whereby the solder 140 is removed by melting it (e.g., by applying heat H as shown in FIG. 2E) so that the underlying portion of the first metal layer 130 is exposed to form an exposed portion 130E of the first metal layer portion 130, wherein the first metal layer 130 serves as a first electrode as noted above. The exposed portion 130E serves as an electrical contact for the resulting electrolytic capacitor. FIG. 2G is similar to FIG. 2E and shows the exposed portion 130E that defines an electrical contact in the first metal layer 130 for the resulting electrolytic capacitor device 200.

In another example of the above process, the second metal layer 160 is formed using an ALD process rather than a more localized electrolytic deposition process. In this case, the process is modified to include additional solder elements formed on the dielectric layer prior to depositing the second metal layer 160 using ALD. The additional solder elements serve to define the second electrode while prevent a short-circuit path between the first and second metal layers 130 and 160.

Another Example Electrode-Based Electrical Device and Masking Process

The methods disclosed herein are generally applicable to electrode-based electrical devices where a portion of a metal layer of a device needs to be masked when forming the device so that it can later be exposed to provide a metal contact for making an external electrical connection. For example, high-surface-area capacitors with high-aspect-ratio features such as trenches or through holes (e.g., capillaries, such as discussed above) need to be processed to form electrodes that require electrical contacts.

Figure 3A:
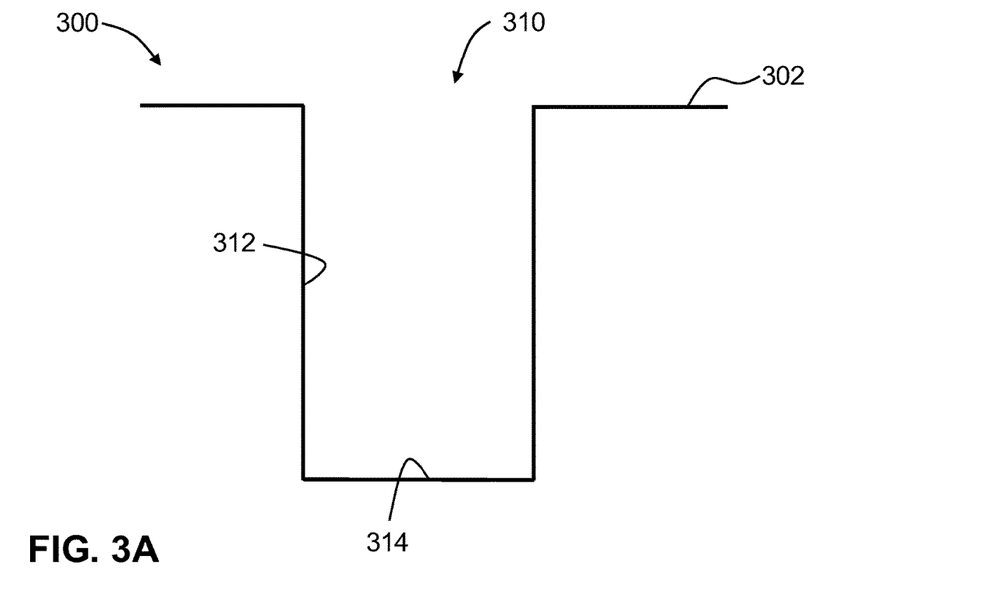
FIGS. 3A through 3H are cross-sectional views that show an example ALD-based process and masking method for substrate having high-aspect-ratio trench features such as used to form a metal-insulator-metal (MIM) capacitor.

A general method of forming electrical contacts for an electrode-based device is now described with reference to FIGS. 3A through 3H. FIG. 3A is a cross-sectional view of a portion of a substrate 300 that has an upper surface 302 and a high-aspect-ratio (HAR) structure 310 in the form of a trench defined by sidewalls 312 and a bottom wall 314. The substrate 300 can be made of aerogel, anodic aluminum oxide, glass, etc. Here, a high-aspect-ratio means that the depth of the HAR structure 310 is greater than its width, e.g., by at least a factor of two, or at least a factor of 4, etc. Many HAR structures 310 can have an aspect ratio of greater than 10 or greater than 100 or even greater than 1000.

Figure 3B:
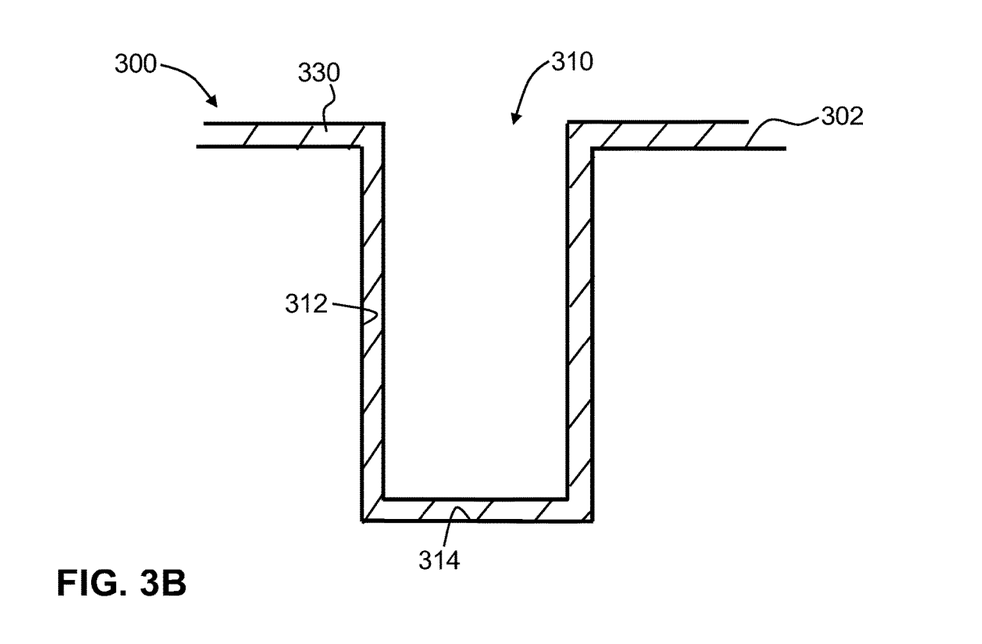

With reference to FIG. 3B, in a first step, a first metal layer 330 is conformally deposited on the sidewalls 312 and bottom wall 314 of HAR structure (trench) 310 using an ALD process. An example first metal layer 330 is made from platinum.

Figure 3C:
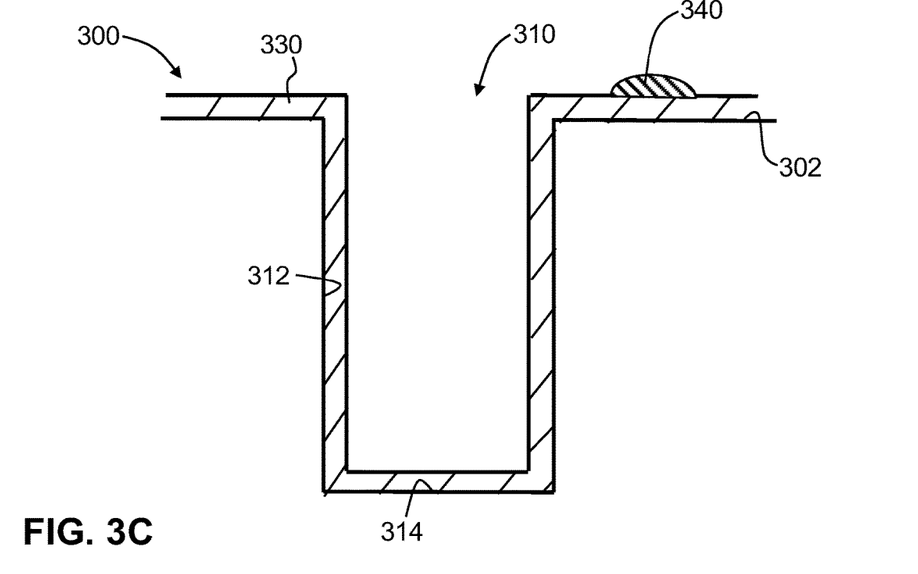

With reference to FIG. 3C, in a second step, at least one first solder portion (e.g., patches) 340 is deposited on portions of the first metal layer 330 that will later serve as electrical contacts for an external connection.

Figure 3D:
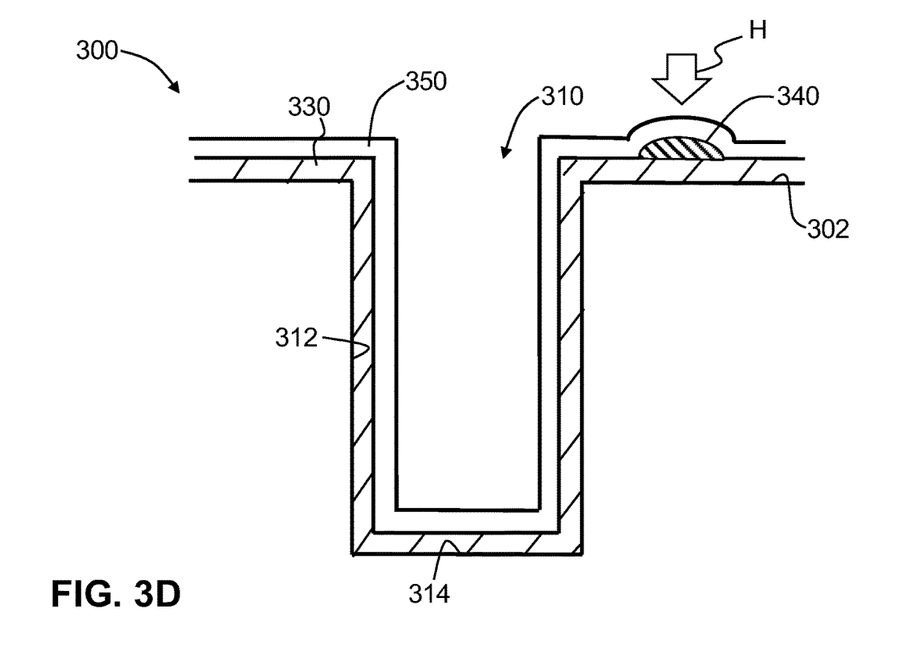

With reference to FIG. 3D, in a third step, a dielectric layer 350 is conformally deposited over the first metal layer 330, including the first solder portions 340, using an ALD process. An example material for the dielectric layer 350 is $AL_2O_3$.

Figure 3E:
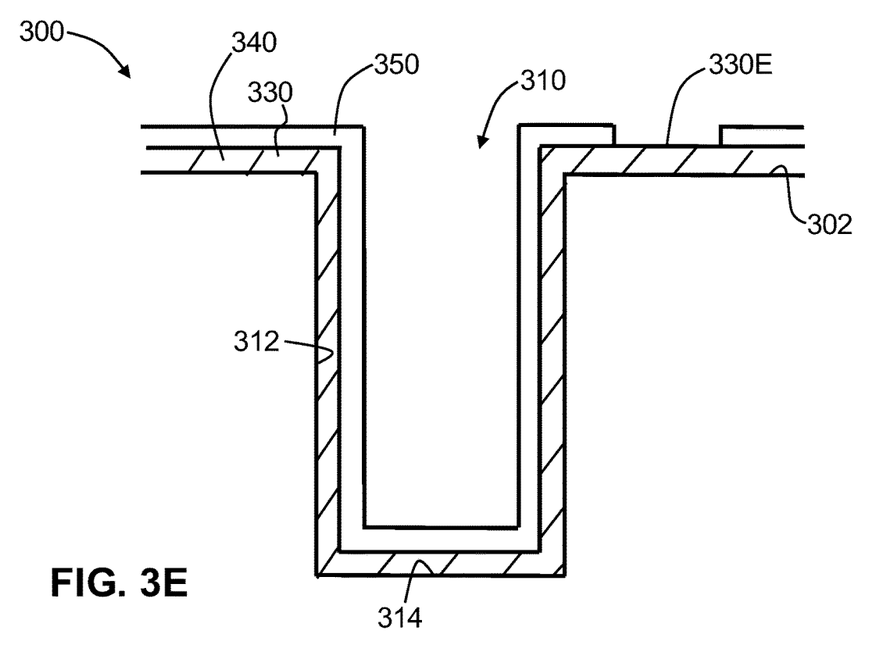

With reference to FIG. 3E, in a fourth step the first solder portions 340 are removed by the application of heat H (see FIG. 3D), which removes the overlying portion of dielectric layer 350 and leaves an exposed metal portion 330E of first metal layer 330.

Figure 3F:
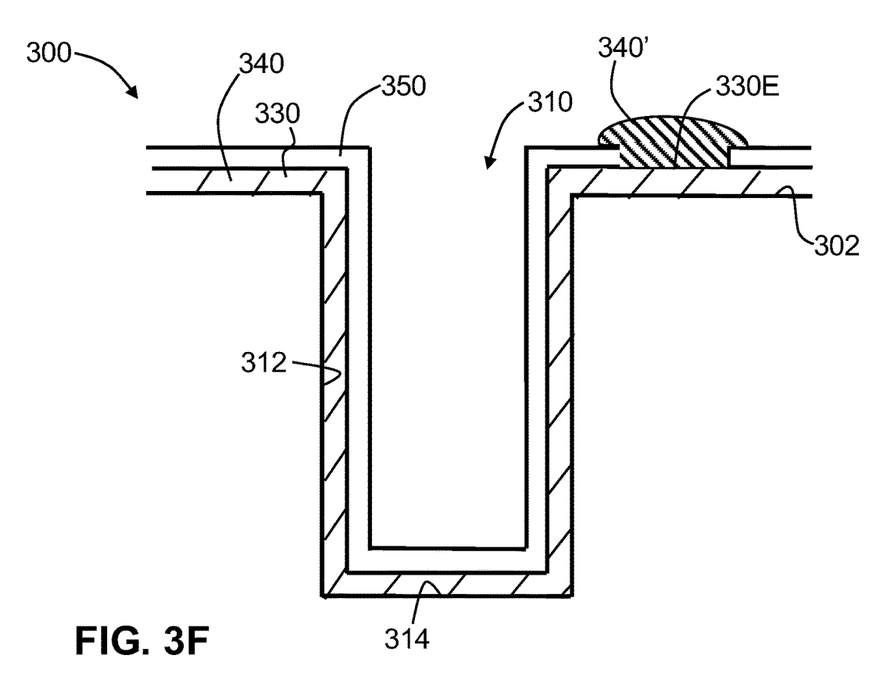

With reference to FIG. 3F, in a fifth step, second solder portions 340' are deposited on the exposed metal portions 330E as well as a small portion 350E of dielectric layer 350 that surrounds the exposed metal portions 330E.

Figure 3G:
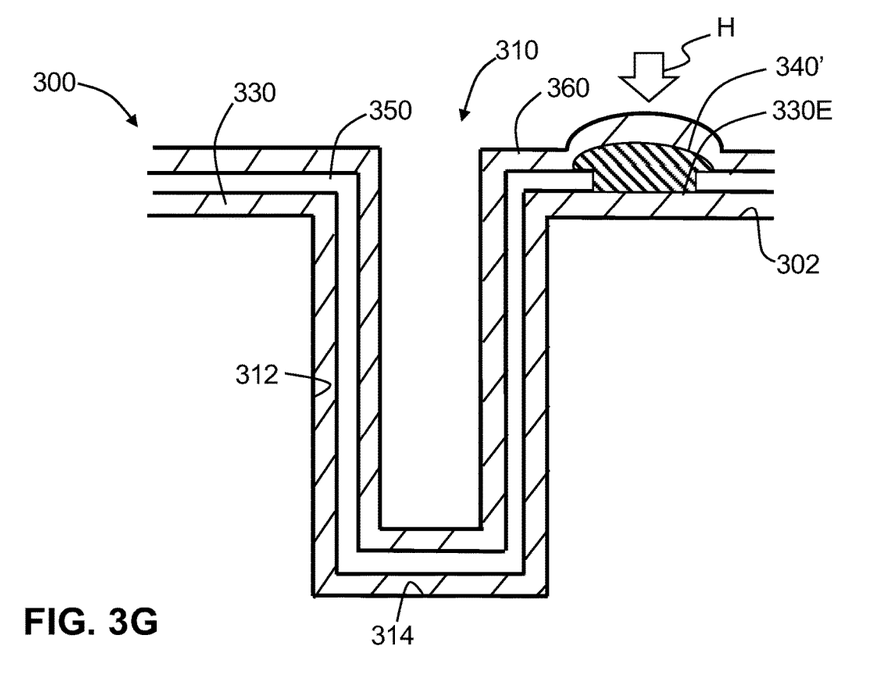

With reference to FIG. 3G, in a sixth step, a second metal layer 360 is deposited over the dielectric layer 350 and second solder portions 340'. The dielectric layer 350 thus serves to electrically isolate the two metal layers 330 and 360.

Figure 3H:
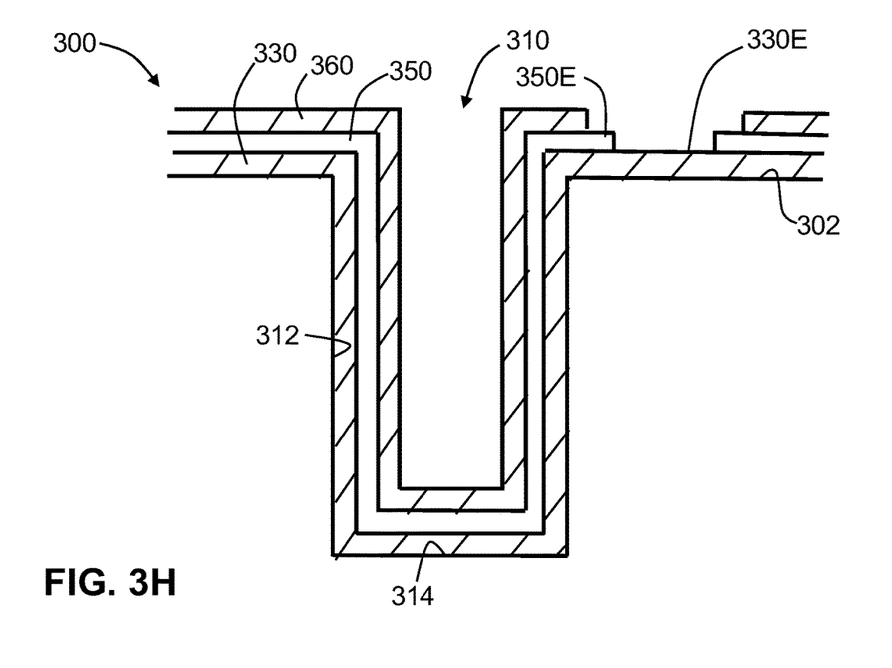

With reference to FIG. 3H, in a seventh step, heat H is applied to remove the second solder portions 340' (see FIG. 3G), which also removes select portions of the second metal layer 360 to expose portions 350E of the underlying dielectric layer 350 while also exposing the exposed metal portions 330E of first metal layer 330 that can serve as electrical contacts. The resulting structure is of the type used in MIM capacitors, for example, wherein the first and second metal layers 330 and 360 serve as first and second electrodes.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of exposing electrical contact members of an electrical device having an active device region and a barrier layer formed by atomic layer deposition (ALD), the method comprising:
   depositing solder elements on the electrical contact members;
   forming the barrier layer using ALD, wherein the barrier layer covers the active device region and also covers the solder elements that respectively cover the electrical contact members; and
   removing respective portions of the barrier layer covering the solder elements after melting the solder elements.

2. The method according to claim 1, wherein the barrier layer includes at least one of $Al_2O_3$, $SiO_2$, $TiO_2$ and $ZrO_2$.

3. The method according to claim 1, wherein the solder elements are formed using solder-bump technology.

4. The method according to claim 1, wherein the electrical contact members are located around at least a portion of a perimeter of the active device region.

5. The method according to claim 1, wherein melting the solder elements includes applying heat to the solder elements through the barrier layer.

6. The method according to claim 5, wherein the heat is provided by a laser.

7. The method according to claim 1, further comprising removing the solder elements from the electrical contact members to expose the electrical contact members.

8. The method according to claim 1, wherein at least portions of each of the solder elements remain on the respective electrical contact members.

9. The method according to claim 1, wherein the active region includes at least one of: a light-emitter, a light sensor, a MEMS device, an electrolytic capacitor and a DMD device.

10. The method according to claim 1, further comprising establishing electrical contact with one or more of the electrical contact members.

11. The method according to claim 1, wherein the electrical contact members include electrical contact pads or electrical contact pins.

12. A method of providing at least one electrical contact for an electrode-based electrical device, comprising:
   a) depositing a first metal layer on a support substrate using an atomic layer deposition (ALD) process, wherein the first metal layer defines a first electrode;
   b) depositing at least one first solder element on the first metal layer;
   c) forming an insulating layer over the first metal layer and the at least one first solder element;
   d) forming at least one exposed portion of the first metal layer after melting the first solder element and removing a corresponding portion of the insulating layer;
   e) depositing at least one second solder element on the at least one exposed portion of the first metal layer;
   f) adding a second metal layer over the insulating layer and the at least one second solder element to define a second electrode; and
   g) defining at least one electrical contact for the first electrode after melting the at least one second solder element and exposing the at least one exposed portion of the first metal layer.

13. The method according to claim 12, wherein the electrode-based electrical device is a capacitor.

14. The method according to claim 12, wherein forming the insulating layer includes depositing an insulating material using an ALD process.

15. The method according to claim 14, wherein the insulating material is $Al_2O_3$.

16. The method according to claim 12, wherein the support substrate comprises a micro-capillary plate made of an insulating material.

17. The method according to claim 14, wherein at least one of the first and second metal layers is made of platinum.

18. The method according to claim 12, wherein the support substrate includes high-aspect-ratio features.

19. The method according to claim 12, wherein the electrode-based electrical device is a metal-oxide-metal capacitor.

20. The method according to claim 12, wherein the at least one first and second solder elements includes respective pluralities of the first and second solder elements.

21. The method according to claim 12, wherein act e) includes the at least one second solder element covering a portion of the insulating layer immediately adjacent the at least one exposed portion of the first metal layer, and wherein act g) exposes the portion of the insulating layer that was covered in act e).

\* \* \* \* \*